Aug. 20, 1963 F. P. SMITH 3,101,447

MODULATED OSCILLATOR CIRCUIT

Filed Nov. 10, 1960

INVENTOR.
FRANK P. SMITH
BY
Lockwood, Woodard, Smith & Weikart
Attorneys

United States Patent Office 3,101,447

Patented Aug. 20, 1963

3,101,447

MODULATED OSCILLATOR CIRCUIT

Frank P. Smith, Amber, Pa., assignor to The Magnavox Company, Fort Wayne, Ind., a corporation of Delaware Filed Nov. 10, 1960, Ser. No. 68,456
4 Claims. (Cl. 325—105)

Figure 1:
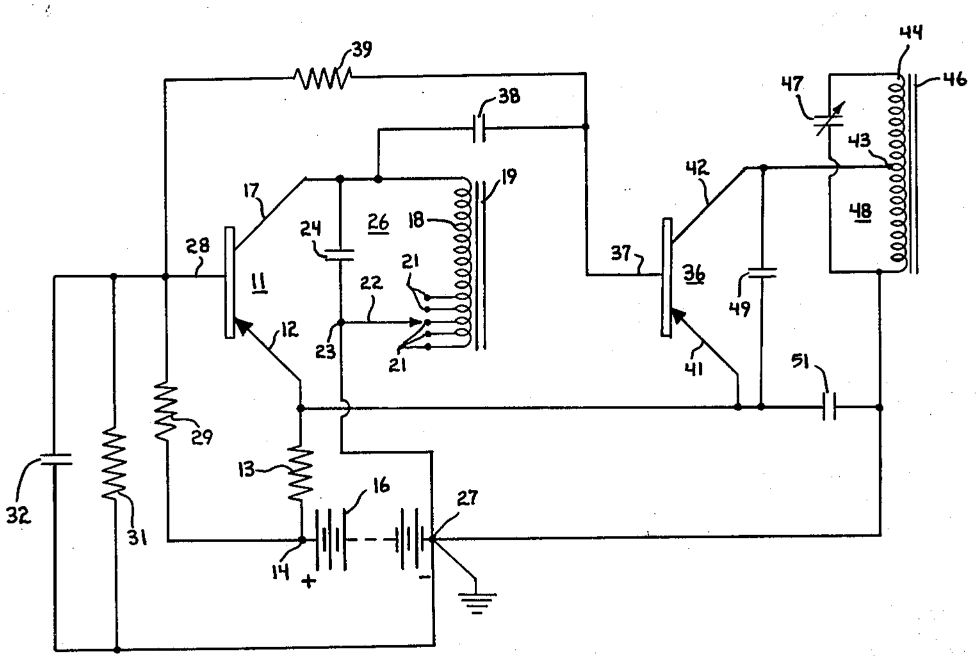

This invention is related generally to oscillators, and more particularly to radio frequency RF oscillators modulated by audio frequency AF oscillators.

Attendant upon the employment of semi-conductor devices in oscillator circuitry, problems previously experienced particularly in the nature of instability have been magnified. These problems generally can be attributed to one or several factors including supply voltage, ambient temperatures and temperature characteristics of the components employed.

It is a general object of the present invention to provide an improved oscillator circuit.

It is a more specific object of the present invention to provide an oscillator circuit particularly well suited to employment of semi-conductor devices.

It is another object of this invention to provide an oscillator circuit having few parts, small size, and light weight.

It is another object of this invention to provide an oscillator circuit having improved stability.

It is another object of this invention to provide an oscillator circuit whose performance is not varied significantly by supply voltage variations and by temperature effects.

This invention includes in its scope an audio frequency oscillator driving a radio frequency oscillator. Both oscillators employ transistors and the coupling of the RF oscillator to the audio oscillator is such that the RF oscillator functions as an emitter follower at audio frequencies and as a grounded base oscillator at radio frequencies.

The full nature of the invention will be understood from the accompanying drawing and the following description and claims:

The single figure of drawing, FIG. 1, shows a characteristic embodiment of this invention.

In FIG. 1 there is shown an audio frequency oscillator including transistor 11 of the PNP type having an emitter 12 coupled through resistor 13 to the positive terminal 14 of a source of electrical energy represented by a battery 16. The collector 17 is coupled to winding 18 of the audio frequency transformer 19.

In addition to having a gap adjustment, the transformer 19 has a number of taps 21 to facilitate selection of the audio frequency desired. The adjustable contact 22 of the transformer 19 is connected at junction 23 to a capacitor 24 connected in turn to the collector 17 of transistor 11, capacitor 24 and portion of the winding 18 thus constituting a tank circuit 26. Junction 23 is directly connected to the negative terminal 27 of the battery 16 completing the direct current emitter-collector path. Terminal 27 may be ground for the circuit.

The base 28 of transistor 11 receives an appropriate bias by means of the resistance divider including the resistor 29 coupled between terminal 14 and base 28 and the resistor 31 coupled between terminal 27 and the base 28. A capacitor 32 is connected across resistance 31 to remove spurious RF voltages in transistor 11.

The RF oscillator shown in FIG. 1 includes transistor 36 having a base 37 coupled to the audio oscillator output through the capacitor 38 coupled to the collector 17 of transistor 11. A resistance 39 couples the base 37 of transistor 36 to the base 28 of transistor 11, tending to minimize variations in loop gain with transistor and battery variations.

The emitter 41 of transistor 36 is connected to emitter 12 of transistor 11. The collector 42 of transistor 36 is coupled to a tap 43 of winding 44 of a ferrite antenna 46. Variable capacitor 47 is connected across the winding 44 of antenna 46 to constitute a tank circuit 48. Circuit 48 is connected to terminal 27 of battery 16.

A capacitor 49 is connected across the emitter and collector of transistor 36 and the emitter 41 is A.C. coupled to ground through capacitor 51.

As noted above, the audio frequency is controlled by the taps and by a gap adjustment on the transformer 19. The gap adjustment is used to set a proper audio frequency in one tap position of the adjustable contact 22, and the transformer turns ratio between the taps controls the other desired frequencies. This allows precise control of audio frequencies regardless of relatively large component variation. Examples of audio frequencies which have been employed are 45 to 85 cycles per second.

The audio output base modulates an RF carrier generated by transistor 36 in a capacitively tapped circuit, radiating from the ferrite bar antenna 46. A typical carrier frequency employed is three megacycles.

The coupling of transistor 36 to the audio oscillator as an emitter follower minimizes loading of the audio tuned circuit thereby reducing audio instability.

Bias for transistor 36 is obtained from the junction of resistance 29 and 31 effectively A.C. grounding the base of transistor 11, avoiding need of an electrolytic capacitor between the base 28 and the battery 16.

Resistance 39 inserts a negative feedback tending to reduce variations in loop gain of the audio loop with transistors and their temperature and battery variations.

The combination of capacitors 38 and 24 functions to ground the base 37 of transistor 36 at radio frequencies so that it functions at the radio frequencies as a grounded base oscillator while at audio frequencies, as noted above, it functions as an emitter follower.

For purposes of example only, the following is a list of values of components which have been successfully employed in the circuit of FIG. 1:

| | |
|---|---|
| 31=10K | 38=.068 mf. |
| 29=10K | 24=.47 mf. |
| 13=8.2K | 51=330 mmf. |
| 39=22K | 49=33 mmf. |
| 16=22½ v. | 47=10–50 mmf. |
| 11=2N109 | 32=.01 mf. |
| 36=2N139 | |

19=¼ x ¼ laminated iron core, adj. gap, bobbin wound 12,000 turns #44 wire with 4 taps.

46=⅛ x ⅝ 3" flat ferrite bar antenna with tap at approx. 60%.

While the invention has been disclosed and described in some detail in the drawings and foregoing description, they are to be considered as illustrative and not restrictive in character, as modifications may readily suggest themselves to persons skilled in this art and within the broad scope of the invention, reference being had to the appended claims.

The invention claimed is:

1. An electronic circuit comprising: a first semi-conductor device coupled to a source of electrical energy; a tuned circuit and output means coupled to said device; a second semi-conductor device coupled to a source of electrical energy and having emitter and base elements and coupled to said first device as an emitter follower to provide a feedback path for said first device to form a first oscillator; a tuned circuit and feedback means coupled to said second device to form a second oscillator; and a coupling between said output means and a base element of said second device whereby said second oscillator is modulated by said first oscillator.

2. An electronic circuit comprising: a first transistor coupled to a source of electrical energy; a tuned circuit and output means coupled to the collector of said transistor; a second transistor coupled to a source of electrical energy and having an emitter and coupled to the emitter of said first transistor to provide a feedback path to form a first oscillator; a tuned circuit and feedback means coupled to said second transistor to form a second oscillator; and a coupling between said output means and the base of said second transistor for modulation of said second oscillator by said first oscillator.

3. An electronic circuit comprising: a first transistor coupled to a source of electrical energy; a tuned circuit and output means coupled to the collector of said transistor; a second transistor coupled to a source of electrical energy and having an emitter and coupled to the emitter of said first transistor to provide a feedback path to form a first oscillator; a tuned circuit and feedback means coupled to said second transistor to form a second oscillator; a coupling between said output means and the base of said second transistor for modulation of said second oscillator by said first oscillator, and feedback means coupled between the bases of said transistors.

4. An electronic circuit comprising: a first transistor coupled to a source of electrical energy; a tuned circuit, including a variable gap transformer with multiple taps and output means coupled to said transistor; a second transistor coupled to a source of electrical energy and having an emitter coupled to the emitter of said first transistor to provide a feedback path to form a first oscillator; a tuned circuit, including a variable capacitor and an antenna, and feedback means coupled to said second transistor to form a second oscillator; a capacitive coupling between said output means and the base of said second transistor for modulation of said second oscillator by said first oscillator, and a resistance coupled between the bases of said transistors to provide a negative stabilizing feedback.

References Cited in the file of this patent

UNITED STATES PATENTS

| | | |
|---|---|---|
| 2,845,536 | Goldstein | July 29, 1958 |
| 2,855,508 | Barlow | Oct. 7, 1958 |
| 2,935,607 | Koch | May 3, 1960 |
| 2,995,652 | Towler | Aug. 8, 1961 |

OTHER REFERENCES

Broadcast-Band Test Oscillator Using Transistors "Fleming," Radio and Television News, Oct. 1955, pp. 48–50.